United States Patent
Chiang et al.

(10) Patent No.: US 7,600,557 B2
(45) Date of Patent: Oct. 13, 2009

(54) HEAT SINK MECHANISM

(75) Inventors: Shih-Chieh Chiang, Sinjhuang (TW);
Lin-Yu Lee, Sinjhuang (TW)

(73) Assignee: Asia Vital Components Co., Ltd., Taipei County (TW)

( * ) Notice: Subject to any disclaimer, the term of this patent is extended or adjusted under 35 U.S.C. 154(b) by 118 days.

(21) Appl. No.: 11/955,564

(22) Filed: Dec. 13, 2007

(65) Prior Publication Data
US 2009/0151492 A1 Jun. 18, 2009

(51) Int. Cl.
*H01L 23/40* (2006.01)
*B25B 5/10* (2006.01)

(52) U.S. Cl. .................... 165/80.2; 269/226

(58) Field of Classification Search ............... 165/80.2, 165/185; 74/25; 269/225, 226
See application file for complete search history.

(56) References Cited
U.S. PATENT DOCUMENTS

| | | | | |
|---|---|---|---|---|
| 92,531 A * | 7/1869 | Hooper | .................... | 269/219 |
| 112,342 A * | 3/1871 | Hooper | .................... | 269/218 |
| 5,426,565 A * | 6/1995 | Anderson | .................... | 361/711 |
| 6,119,765 A * | 9/2000 | Lee | .................... | 165/80.3 |
| 6,765,797 B2 * | 7/2004 | Summers et al. | .................... | 361/704 |
| 7,349,220 B2 * | 3/2008 | Lai et al. | .................... | 361/719 |
| 2006/0268523 A1 * | 11/2006 | Lin | .................... | 361/710 |

* cited by examiner

*Primary Examiner*—Allen J Flanigan (57) ABSTRACT

A heat sink mechanism includes a fixed and a movable clamping piece, at least one adjusting gearwheel rotatably mounted to and between the fixed and the movable clamping piece via a fixing shaft while an end of the fixing shaft is screwed to the movable clamping piece, and an adjusting worm shaft rotatably mounted to the fixed clamping piece for driving the adjusting gearwheel to rotate via meshed worm threads on the worm shaft and gear teeth on the adjusting gearwheel. When the adjusting worm shaft is rotated, the meshed worm threads and gear teeth bring the adjusting gearwheel and the fixing shaft thereof to rotate, so that the movable clamping piece screwed to the rotating fixing shaft is brought to move toward or away from the fixed clamping piece to thereby fix the heat sink mechanism to a heat-producing source to achieve the purpose of heat dissipation.

7 Claims, 7 Drawing Sheets

HEAT SINK MECHANISM

FIELD OF THE INVENTION

The present invention relates to a heat sink assembly for a beat memory, and more particularly to a heat sink mechanism for rise outside a memory to dissipate heat produced by the memory during the operation thereof, so as to protect internal chips against damage due to high temperature.

BACKGROUND OF THE INVENTION

Electronic apparatus with extremely high operating performance have been constantly developed by the high-tech industrial field. With the enhanced operating performance and speed, heat-producing elements inside the electronic apparatus produce more heat during the operation thereof. Therefore, it has become an important issue to develop modular heat sink for mounting to different heat-producing sources for lowering the temperature thereof. Similarly, with the increased speed in accessing data, a memory in the electronic apparatus consumes more electric current than before and accordingly, produces more heat during the operation thereof. When the heat produced by the computing unit in the electronic apparatus increases without being properly dissipated to lower the temperature of the computing unit, the electronic apparatus is subjected to down or low running efficiency. In a worse condition, the computing unit might become damaged.

A conventional heat sink assembly for the memory of a computing unit includes a heat dissipating unit, which may include an integrally formed U-shaped heat radiating member made of a heat conducting material or two separated symmetrical heat radiating members, so that a heat-producing memory may be enclosed in or clamped between the heat radiating members; and a holding fixture, which includes at least one holding element for holding the two heat radiating members and the memory together.

While it provides good heat dissipating effect to the memory, the conventional heat sink assembly is not easy to install and it is uneasy to control the clamping force provided by the holding fixture. In the event the provided clamping force is too small, it is possible the heat dissipating unit could not be firmly held to the memory. On the other hand, when the provided clamping force is too large, it is possible to damage the IC chip or circuit board on the memory. The holding fixture is also subjected to elastic fatigue to finally lose its elasticity and clamping ability when it has been repeatedly mounted to and dismounted from the memory over a period of time.

It is therefore tried by the inventor to develop an improved heat sink mechanism to overcome the problems in the prior art.

SUMMARY OF THE INVENTION

A primary object of the present invention is to provide a heat sink mechanism for use with a memory in an electronic apparatus. The heat sink mechanism includes a heat dissipating unit consisting of a fixed clamping piece and a movable clamping piece that are parallelly arranged to provide heat conducting and dissipating effect, an adjusting worm shaft rotatably mounted on the fixed clamping piece, and an adjusting gearwheel mounted to and between the two clamping pieces via a fixing shaft, which is rotatably connected at two ends to the fixed and the movable clamping piece. The adjusting gearwheel is provided along a circumferential surface with a plurality of gear teeth adapted to mesh with worm threads provided on the adjusting worm shaft. One end of the fixing shaft connected to the movable clamping piece is provided with screw threads to mesh with an internally threaded hole on the movable clamping piece.

To contact the heat sink mechanism with the memory, first rotate the adjusting worm shaft. At this point, the adjusting gearwheel and accordingly, the screw threads provided on one end of the fixing shaft are brought by the meshed worm threads and gear teeth to rotate. Meanwhile, the screw threads on the rotating fixing shaft meshed with the internally threaded hole on the movable clamping piece bring the movable clamping piece to move toward the fixed clamping piece. The adjusting worm shaft may be finely adjusted until a space between the fixed and the movable clamping piece is suitable for stably clamping the heat-producing memory in the heat sink mechanism.

The heat sink mechanism according to the present invention provides at least the following advantages:
1. The heat sink mechanism can be easily mounted to and dismounted from the heat-producing memory.
2. The heat sink mechanism includes simple elements and can be produced at low cost.
3. The heat sink mechanism can be repeatedly used.
4. The heat sink mechanism can he finely adjusted according to actual need in use without the risk of damaging the heat-producing memory during mounting or dismounting the heat sink mechanism.

The heat sink mechanism provides stable and firm clamping to the heat-producing memory without the risk of loosening from the memory.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
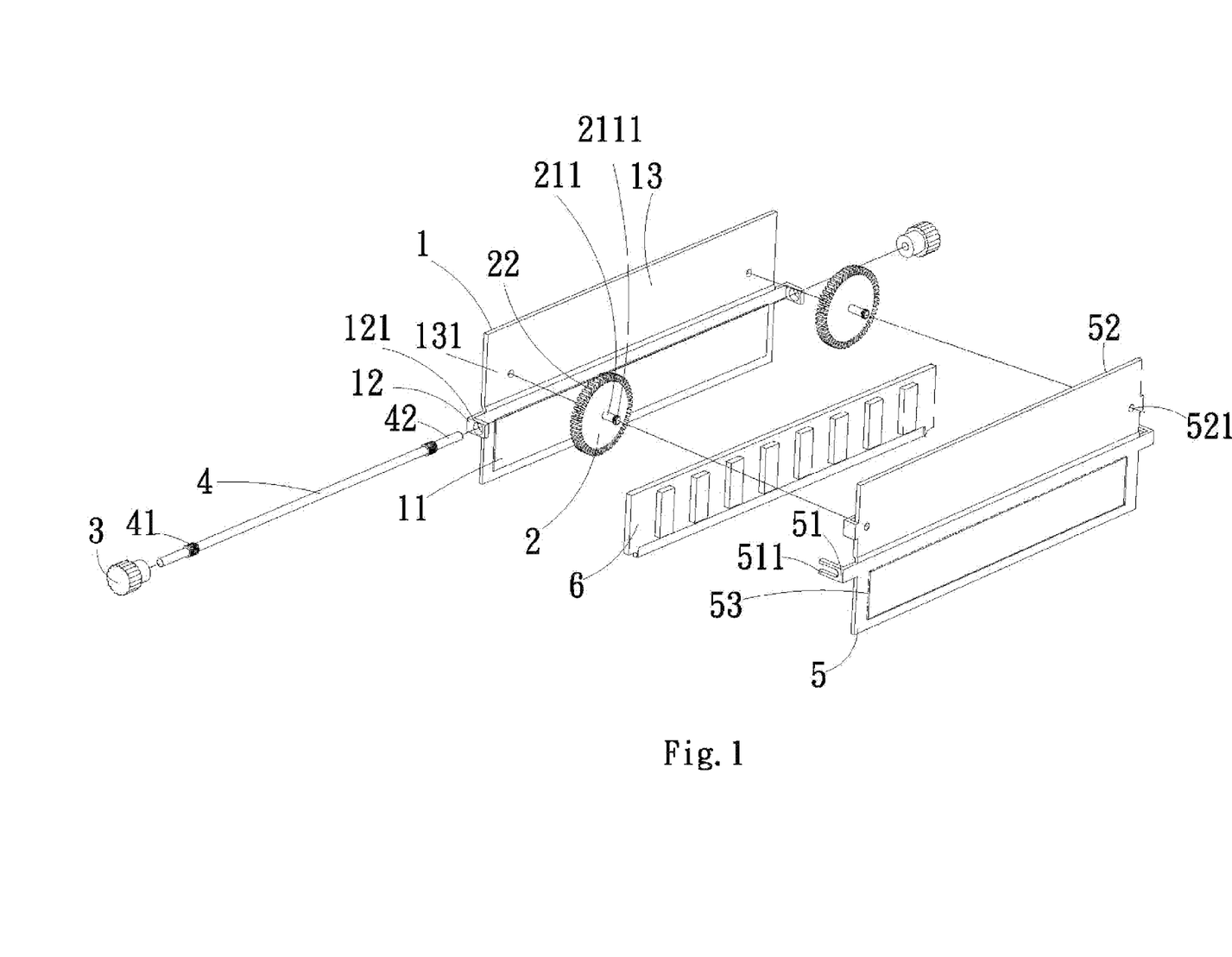
FIG. 1 is an exploded perspective view of a heat sink mechanism according to a preferred embodiment of the present invention.
Figure 2:
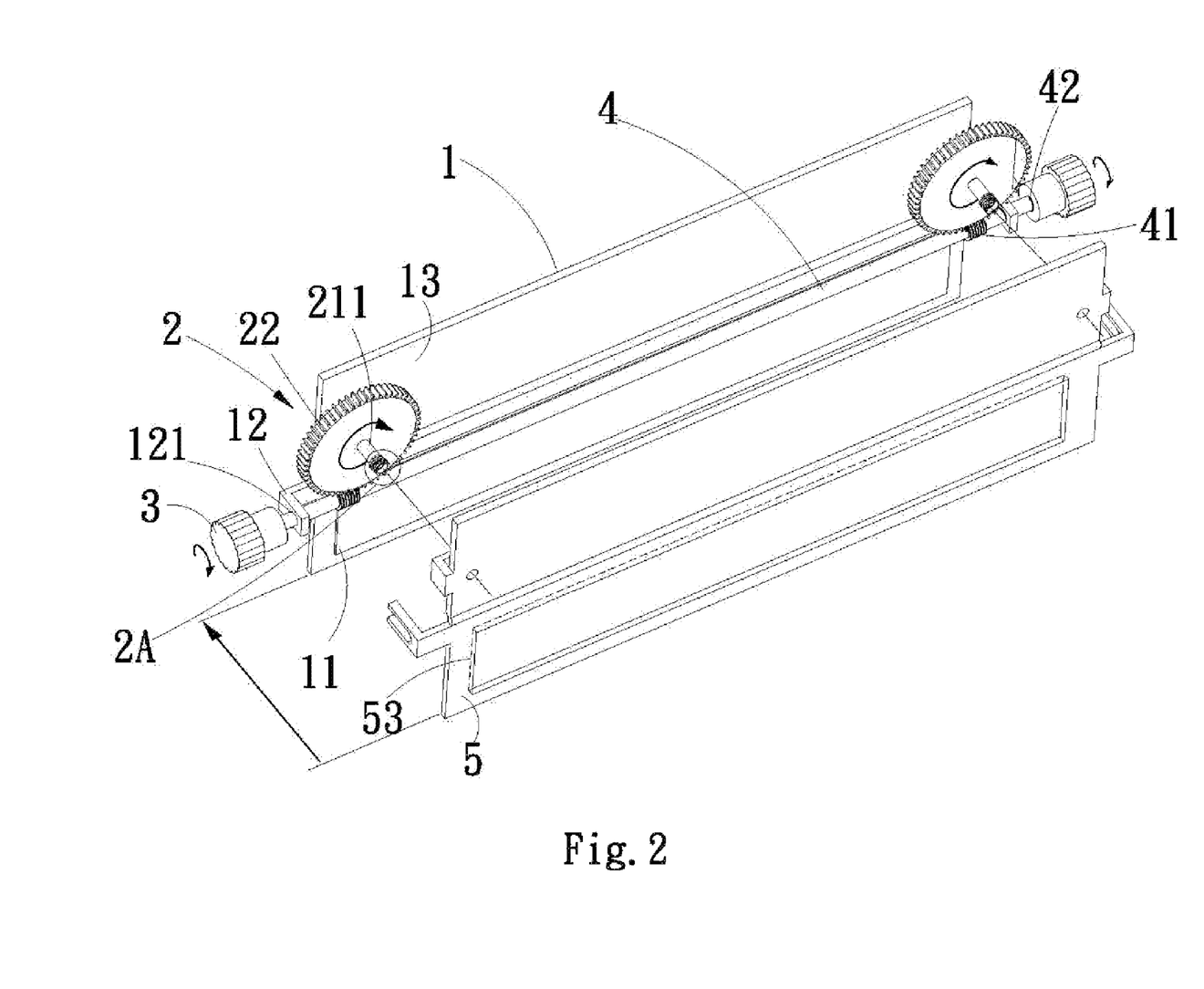
FIG. 2 is a perspective view showing the manipulation of the heat sink mechanism of the present invention.
Figure 2A:
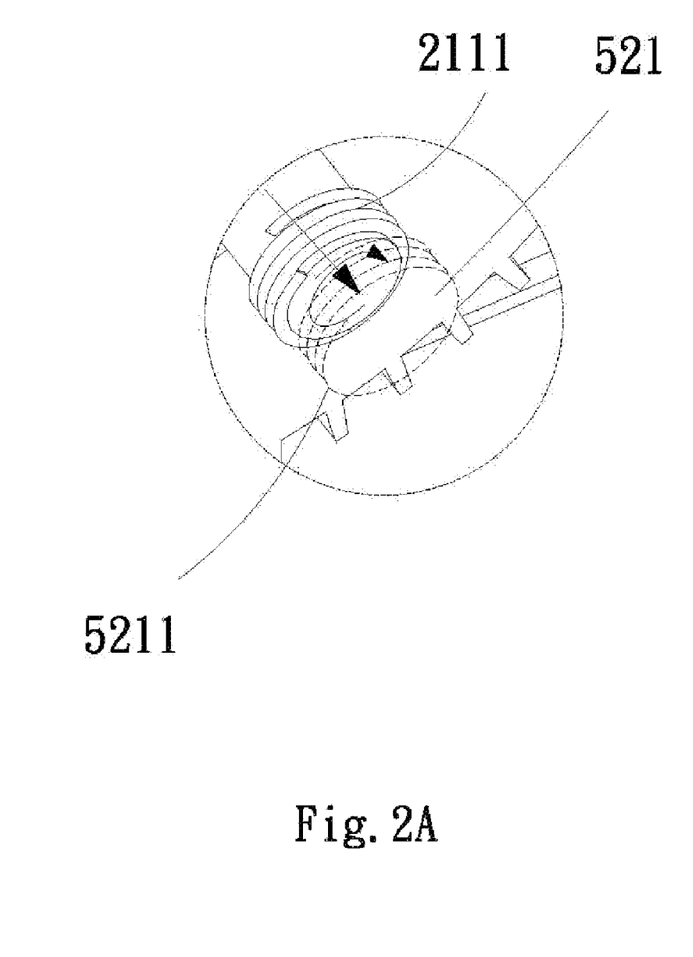
FIG. 2A is an enlarged view of the circled area 2A of FIG. 2 showing internal threads of a shaft hole provided on a movable clamping piece of the heat sink mechanism of the present invention.
Figure 3:
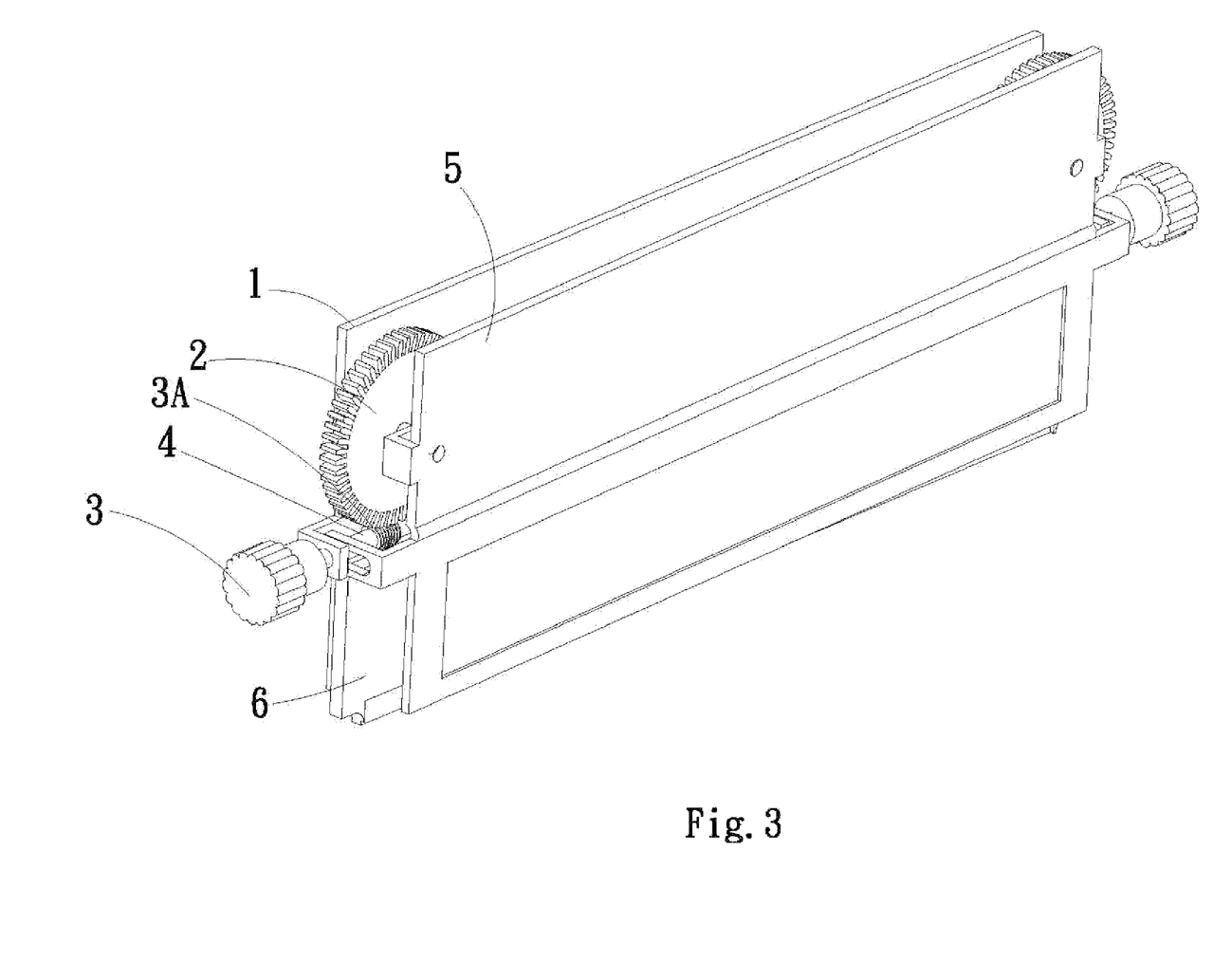
FIG. 3 is an assembled perspective view of FIG. 1.

Please refer to FIG. 1 that is an exploded perspective view of a heat sink mechanism according to a preferred embodiment of the present invention. As can be clearly seen from FIG. 1, the heat sink mechanism according to the present invention includes a fixed clamping piece 1, at least one adjusting gearwheel 2, an adjusting worm shaft 4, and a movable clamping piece 5.

The fixed clamping piece 1 is provided at two longitudinally opposite ends with a shaft holder 12 each. Each of the shaft holders 12 has a through shaft hole 121 formed thereon. The fixed clamping piece 1 has an inner upper surface 13 that is provided at a predetermined position with at least one shaft hole 131, and an inner lower contact surface 11 for bearing against a heat-producing source 6.

The movable clamping piece 5 is arranged in parallel with the fixed clamping piece 1 and provided at two longitudinally opposite ends with a shaft holder 51 each. Each of the shaft holders 51 has a slot 511 formed thereon. The slots 511 are extended through the shaft holders 51 and have a side opening facing toward the fixed clamping piece 1. The movable clamping piece 5 has an inner upper surface 52 that is provided at a predetermined position with at least one shaft hole 521 provided with internal threads 5211, and an inner lower contact surface 53 for bearing against the heat-producing source 6.

The adjusting worm shaft 4 is provided with worm threads 41, and is rotatably extended across the fixed clamping piece 1 with two-opposite ends of the adjusting worm shaft 4 outward extended through the shaft holes 121 on the two shaft holders 12 of the fixed clamping piece 1. At least one of the two ends 42 of the worm shaft 4 has an adjusting knob 3 fixedly mounted thereto.

The at least one adjusting gearwheel 2 is provided along a circumferential surface with a plurality of equally spaced gear teeth 22, and at a center with a fixing shaft 211 having two opposite ends axially outward projected from two end surfaces of the adjusting gearwheel 2. One end of the fixing shaft 211 is rotatably extended into the at least one through shaft hole 131 formed on the inner upper surface 13 of the fixed clamping piece 1, and the other end of the fixing shaft 211 is provided with screw threads 2111 for meshing with the internal threads 5211 of the at least one shaft hole 521 formed on the inner upper surface 52 of the movable clamping piece 5. When the adjusting gearwheel 2 is mounted to the fixed clamping piece 1, the gear teeth 22 thereon would mesh with the worm threads 41 on the adjusting worm shaft 4.

Figure 4:
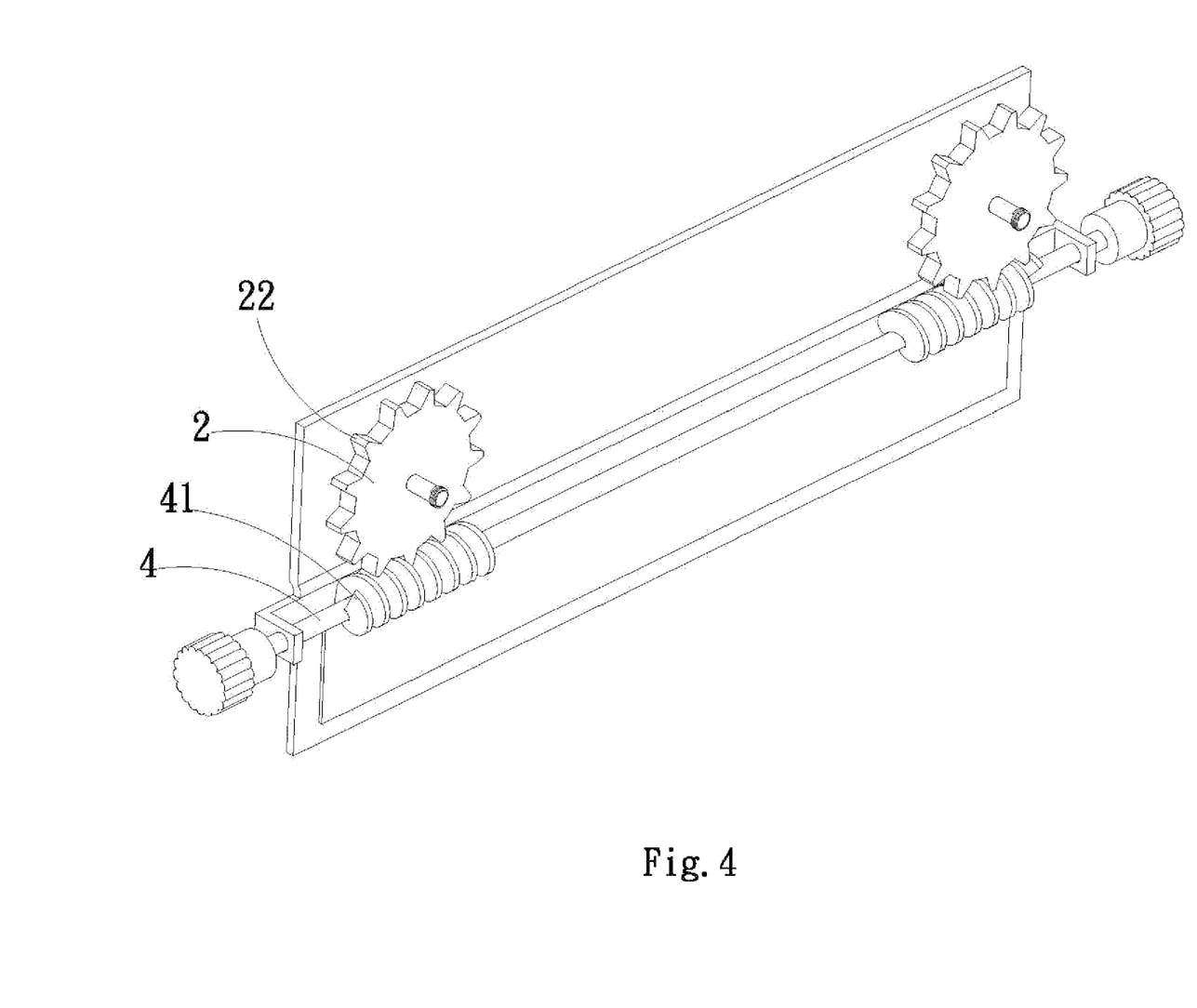
FIG. 4 is a fragmentary assembled perspective view showing another preferred embodiment of the present invention.

Please refer to FIGS. 1, 2, 2A, 3, and 4 at the same time. When the adjusting knob 3 is turned clockwise, the adjusting worm shaft 4 fixedly connected to the adjusting knob 3 is brought to rotate clockwise at the same time, and the adjusting gearwheel 2 is brought by the meshed worm threads 41 and gear teeth 22 to rotate counterclockwise. In an embodiment of the present invention as shown in FIG. 4, the worm threads 41 or the adjusting worm shaft 4 and the gear teeth 22 on the adjusting gearwheel 2 are trapezoidal teeth to prevent skidding thereof. When the adjusting gearwheel 2 rotates counterclockwise, the fixing shaft 211 projected from two end surfaces of the adjusting gearwheel 2 and the screw threads 2111 provided on one end of the fixing shaft 211 are brought to synchronously rotate counter clockwise, bringing the end of the fixing shaft 211 with the screw threads 2111 to mesh with the internal threads 5211 of the shaft hole 521 on the movable clamping piece 5. When the screw threads 2111 mesh with the threads 5211 in the shaft hole 521, the movable-clamping piece 5 is brought to move toward the fixed clamping piece 1 to gradually reduce a space between the two clamping pieces 1 and 5.

On the other hand, when the adjusting knob 3 is turned counterclockwise, the adjusting worm shaft 4 and the worm threads 41 are brought to turn counterclockwise, and all other driven elements 2, 22, 211, 2111 that are cooperating with the adjusting knob 3 are brought to turn clockwise, so that the movable clamping piece 5 is brought to move away from the fixed clamping piece 1 to gradually increase the space between them. The contact surface 53 at the inner lower part of the movable clamping piece 5 and the contact surface 11 at the inner lower part of the fixed clamping piece 1 are areas of the two clamping pieces 1, 5 in contact with a heat source 6, such as a memory. By turning the adjusting knob 3 clockwise or counterclockwise, the tightness of contact between the two contact surfaces 11, 53 and the memory 6 is properly adjustable.

Figure 5:
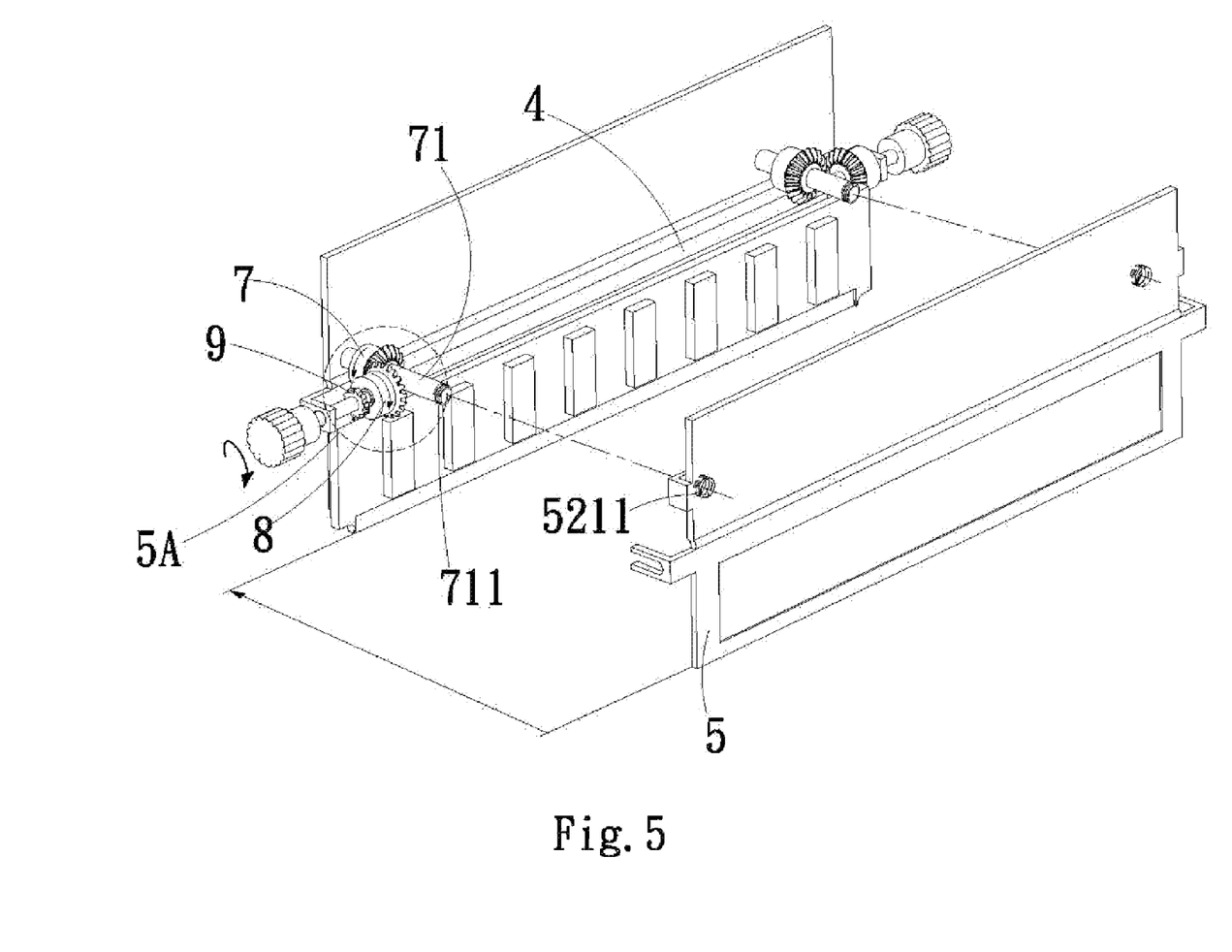
FIG. 5 is a partially assembled perspective view showing a further preferred embodiment of the present invention.
Figure 5A:
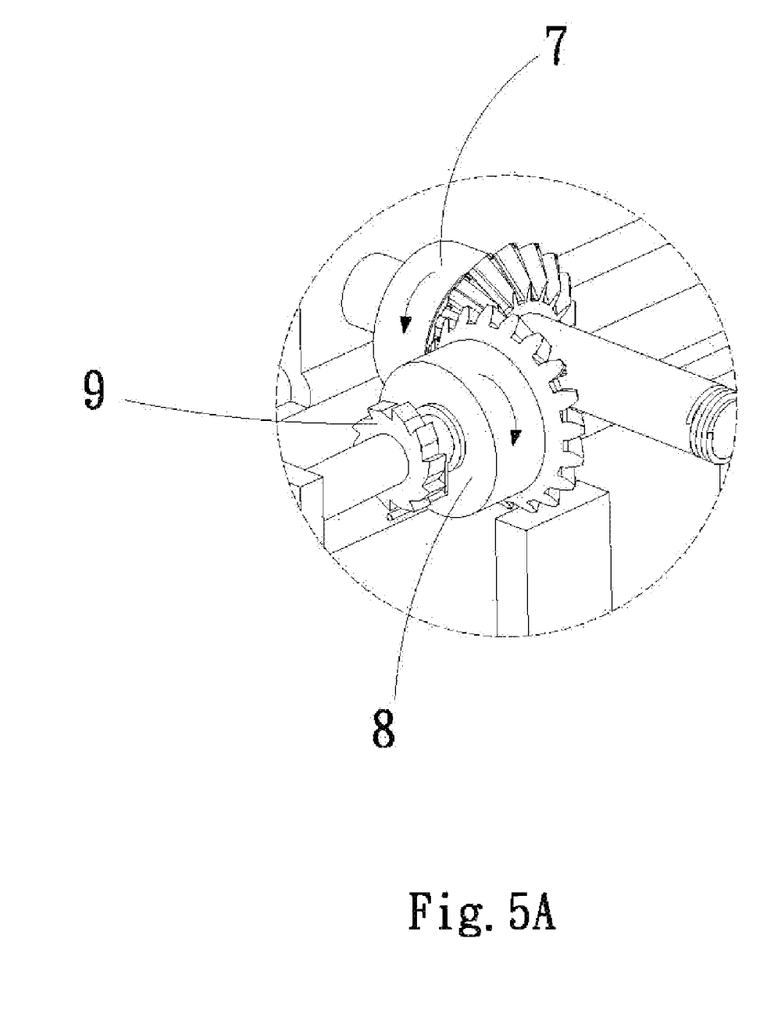
FIG. 5A is an enlarged view of the circled area 5A of FIG. 5 showing the meshing of two bevel gears.

Please refer to FIG. 5 that is a partially assembled perspective view showing a further preferred embodiment of the present invention. In this further embodiment, the adjusting gearwheel 2 is replaced by a bevel gear 7, and another bevel gear 8 is additionally mounted on the adjusting worm shaft 4, such that the bevel gears 7 and 8 are perpendicular to and mesh with each other. When the adjusting worm shaft 4 is rotated, the bevel gear 8 mounted thereon is brought to rotate at the same time. Meanwhile, the bevel gear 7 meshed with the bevel gear 8 is also caused to rotate, as shown in FIG. 5A. The bevel gear 7 has a fixing shaft 71, which is provided at one end with screw threads 711 for meshing with the internal threads 5211 of the shaft hole 521 formed on the inner upper surface 52 of the movable clamping piece 5. When the bevel gear 7 is rotated, the screw threads 711 meshed with the internal threads 5211 bring the fixing shaft 71 to screw into or out of the shaft hole 521, so that the movable clamping piece 5 is moved toward or away from the fixed clamping piece 1 to gradually reduce or increase a space between the two clamping pieces 1 and 5. Moreover, a ratchet wheel 9 may be additionally mounted to the adjusting worm shaft 4 to prevent the heat sink mechanism from becoming loosened.

It is noted the fixed and the movable clamping piece 1, 5 are contacted at respective inner surface with the memory or the heat-producing source 6.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A heat sink mechanism, comprising:
   a fixed clamping piece being provided at two longitudinally opposite ends with a shaft holder each, each of which has a through shaft hole formed thereon; the fixed clamping piece having an inner upper surface that is provided at a predetermined position with at least one shaft hole, and an inner lower contact surface for bearing against a heat-producing source;
   a movable clamping piece being arranged in parallel with the fixed clamping piece, and provided at two longitudinally opposite ends with a shaft holder each, each of which is provided with a slot that is extended through the shaft holder and has a side opening facing toward the fixed clamping piece; the movable clamping piece having an inner upper surface that is provided at a predetermined position with at least one internally threaded shaft hole, and an inner lower contact surface for bearing against the heat-producing source;
   an adjusting worm shaft being provided with worm threads, and rotatably mounted on the two shaft holders of the fixed clamping piece; and
   at least one adjusting gearwheel being provided along a circumferential surface with a plurality of equally spaced gear teeth for meshing with the worm threads on the adjusting worm shaft, and at a center with a fixing shaft, two opposite ends of which are axially projected from two opposite end surfaces of the adjusting gearwheel; one of the two ends of the fixing shaft being rotatably extended into the at least one through shaft hole formed on the inner upper surface of the fixed clamping piece, and the other end of the fixing shaft being provided with screw threads for meshing with and screwing to the at least one internally threaded shaft hole formed on the inner upper surface of the movable clamping piece;

whereby when the adjusting worm shaft is turned in a predetermined direction, the adjusting gearwheel and the fixing shaft thereof are brought by the meshed worm threads and gear teeth to rotate, and the movable clamping piece is brought by the meshed screw threads on the rotating fixing shaft and the internally threaded shaft hole on the movable clamping piece to move toward or away from the fixed clamping piece.

2. The heat sink mechanism as claimed in claim 1, wherein the adjusting worm shaft has a ratchet wheel additionally mounted thereon to prevent the heat sink mechanism from becoming loosened.

3. The heat sink mechanism as claimed in claim 1, wherein the gear teeth on the adjusting gearwheel and the worm threads provided on the adjusting worm shaft are trapezoidal teeth to prevent skidding.

4. The heat sink mechanism as claimed in claim 1, wherein the adjusting worm shaft is further provided with a bevel gear.

5. The heat sink mechanism as claimed in claim 4, wherein the adjusting gearwheel is a bevel gear.

6. The heat sink mechanism as claimed in claim 5, wherein the bevel gear on the adjusting worm shaft and the bevel gear forming the adjusting gearwheel are perpendicular to and meshing with each other.

7. The heat sink mechanism as claimed in claim 1, wherein the adjusting worm shaft is provided on at least one end with an adjusting knob for turning the adjusting worm shaft.

* * * * *